US012791949B2

(12) United States Patent
Liu et al.

(10) Patent No.: US 12,791,949 B2
(45) Date of Patent: Nov. 10, 2026

(54) DETECTION METHOD OF EUV PELLICLE STATUS

(71) Applicant: TAIWAN SEMICONDUCTOR MANUFACTURING COMPANY, LTD., Hsinchu (TW)

(72) Inventors: Yen-Hao Liu, Hsinchu City (TW); Shao-Hua Wang, Taoyuan City (TW); Zheng-Hao Zhang, Hsinchu City (TW); Fan-Chi Lin, Hsinchu (TW); Chueh-Chi Kuo, Kaohsiung City (TW); Li-Jui Chen, Hsinchu City (TW); Heng-Hsin Liu, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 967 days.

(21) Appl. No.: 17/830,160

(22) Filed: Jun. 1, 2022

(65) Prior Publication Data

US 2023/0393489 A1 Dec. 7, 2023

(51) Int. Cl.
*G03F 7/00* (2006.01)

(52) U.S. Cl.
CPC ...... *G03F 7/70591* (2013.01); *G03F 7/70741* (2013.01); *G03F 7/7085* (2013.01); *G03F 7/70983* (2013.01)

(58) Field of Classification Search
CPC ............... G03F 7/70591; G03F 7/7085; G03F 7/70983; G03F 7/70741; G03F 7/70; G03F 7/70008; G03F 7/70033; G03F 7/70483–70541; G03F 7/708–70808; G03F 7/70825; G03F 7/70833; G03F 7/70841; G03F 7/70858; G03F 7/70866; G03F 7/709; G03F 7/70908; G03F 7/70916; G03F 7/7095; G03F 7/70958; G03F 7/70991; G03F 7/70975; G03F 1/62;

(Continued)

(56) References Cited

U.S. PATENT DOCUMENTS

2001/0026355 A1* 10/2001 Aoki .................. G03F 7/70933 355/53
2002/0126269 A1* 9/2002 Sato .................... G03F 7/70058 355/53

(Continued)

FOREIGN PATENT DOCUMENTS

WO WO-2016121635 A1 * 8/2016 ............. B65G 49/07

OTHER PUBLICATIONS

English translation of WO2016/121635, published Aug. 4, 2016. (Year: 2016).*

*Primary Examiner* — Christina A Riddle
(74) *Attorney, Agent, or Firm* — Maschoff Brennan

(57) ABSTRACT

A method includes transferring an inner pod of a carrier out from an outer pod of the carrier into a lithography exposure apparatus, the inner pod containing a reticle including a reflective multilayer and a pellicle underlying the reflective multilayer; detecting a condition of the pellicle using a metrology device positioned on a base plate of the inner pod during transferring the inner pod in the lithography exposure apparatus; determining whether the condition of the pellicle is acceptable; issuing a warning when the condition of the pellicle is not acceptable.

20 Claims, 15 Drawing Sheets

(58) Field of Classification Search
CPC ..... G03F 1/68; G03F 1/82; G03F 1/84; G03F 1/86; G06T 7/001; G06T 2207/30148
USPC .................. 355/18, 30, 52–55, 66–77; 430/5
See application file for complete search history.

(56) References Cited

U.S. PATENT DOCUMENTS

| | | | | |
|---|---|---|---|---|
| 2005/0117142 | A1* | 6/2005 | Heerens | G03F 7/707 355/75 |
| 2015/0131069 | A1* | 5/2015 | Ota | G03F 7/70058 359/507 |
| 2016/0078608 | A1* | 3/2016 | Na | G06T 7/001 382/149 |
| 2018/0364561 | A1* | 12/2018 | Vles | G03F 7/7085 |
| 2019/0163070 | A1* | 5/2019 | Shang | G03F 7/70883 |
| 2020/0341366 | A1* | 10/2020 | Brouns | G03F 7/70891 |
| 2021/0300635 | A1* | 9/2021 | Chiu | H01L 21/67386 |

* cited by examiner

DETECTION METHOD OF EUV PELLICLE STATUS

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. As semiconductor devices are scaled down, new techniques are needed to maintain the electronic components' performance from one generation to the next. Device complexity is increasing as manufacturers design smaller feature sizes and more functionality into integrated circuits. Such complex devices may result in more lithography steps.

As semiconductor technologies evolve, increasingly advanced lithography techniques have been widely adopted for use in today's integrated circuit fabrication processes. Photolithographic techniques involve forming a photoresist layer over a substrate, exposing portions of the photoresist material to a pattern of light in accordance with a desired pattern, developing the photoresist material to remove portions of the photoresist material to expose portions of the underlying material. A suitable etching process such as dry etching, wet etching and the like may then be performed on the substrate. As a result, the exposed underlying material may be removed to produce the desired pattern. The lithography process of the integrated circuit may comprise multiple steps in the photolithography process. Due to the complexity of the manufacturing process, each lithography step may employ a reticle through which the pattern of a component of an integrated circuit is generated. As a result, there is a need for transporting the reticle in the factory. Although numerous improvements to the methods of transporting reticles have been invented, they have not been entirely satisfactory in all respects. Consequently, it would be desirable to provide a solution to improve the transportation system so as to mitigate or avoid the production of excess scrap wafer due to improper storage conditions for the reticle during its transportation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
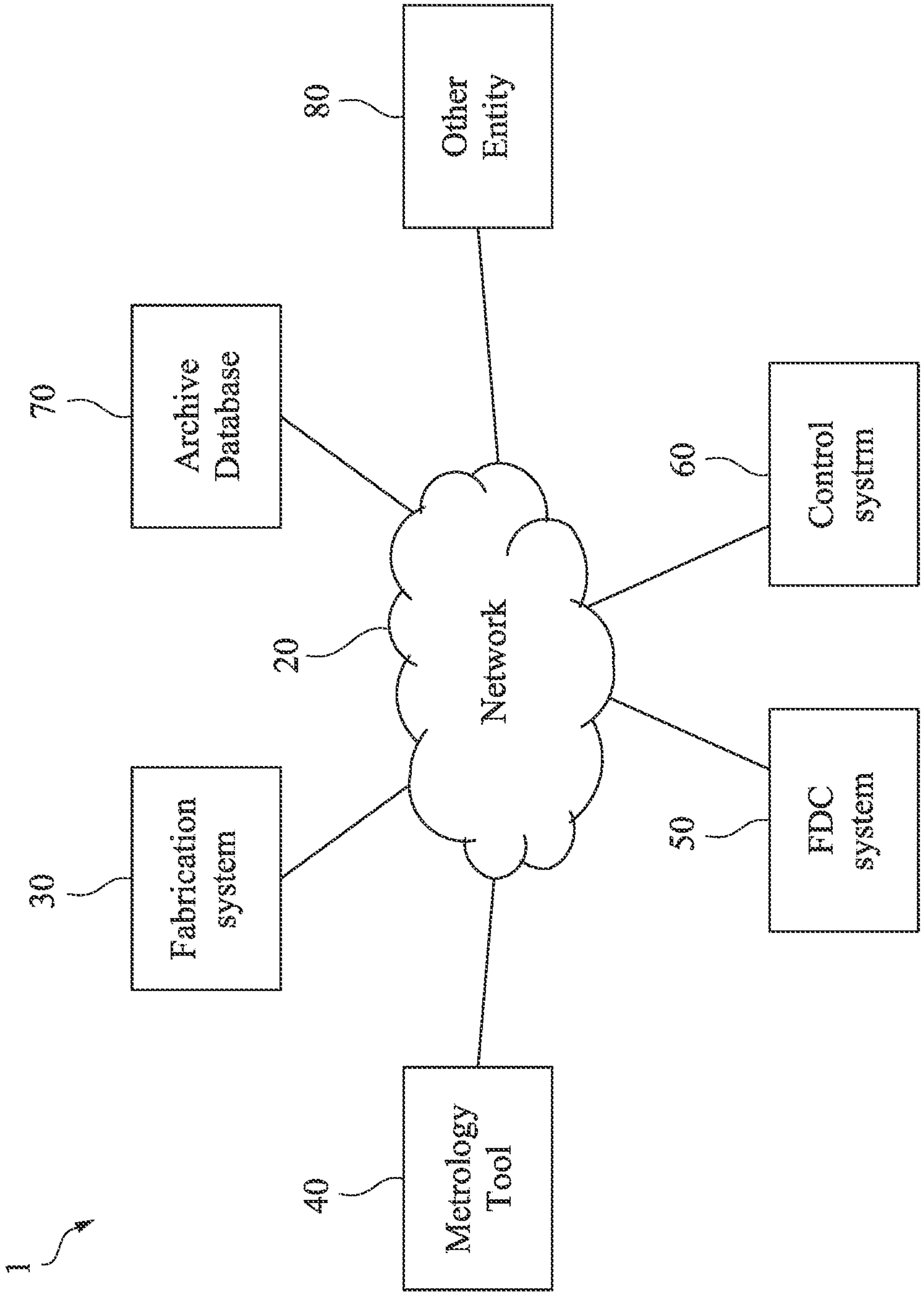
FIG. 1 is a block diagram of a fabrication facility in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to prevent contaminant particles from landing on the EUV mask and degrading the result of photolithography process, a pellicle is formed to cover the EUV mask. The pellicle is made of a thin membrane transparent to the radiation beam used in a lithography patterning process. However, during lithography processes, the EUV mask (and thus the pellicle) may experience various kinds of movement that could rupture, tear, break the pellicle or induce other types of damage to the pellicle, since it is a thin membrane, thereby rendering the mask pellicle system unusable. Therefore, the present disclosure in various embodiments provides a method for monitoring a pellicle condition on the EUV mask during the transferring of the mask without opening EUV inner pod (EIP) cover thereof, which in turn reduces the risk of pellicle damagement and real-time monitors pellicle status during the transferring of the EUV mask.

Reference is made to FIG. 1. FIG. 1 is a block diagram of a fabrication facility in accordance with some embodiments of the present disclosure. The fabrication facility 1 implements integrated circuit manufacturing processes to fabricate integrated circuit devices. For example, the fabrication facility 1 may implement semiconductor manufacturing processes that fabricate semiconductor wafers. It should be noted that, in FIG. 1, the fabrication facility 1 has been simplified for the sake of clarity to better understand the inventive concepts of the present disclosure. Additional features can be added in the fabrication facility 1, and some of the features described below can be replaced or eliminated in other embodiments of the fabrication facility 1. The fabrication facility 1 may include more than one of each of the entities In some embodiments, and may further include other entities not illustrated in the depicted embodiment.

In some embodiments, the fabrication facility 1 includes a network 20 that enables various entities (a fabrication system 30, a metrology device 40, a fault detection and classification (FDC) system 50, a control system 60, an archive data base 70, and another entity 80) to communicate with one another. The network 20 may be a single network or a variety of different networks, such as an intranet, the Internet, another network, or a combination thereof. The network 20 may include wired communication channels, wireless communication channels, or a combination thereof.

Figure 2:
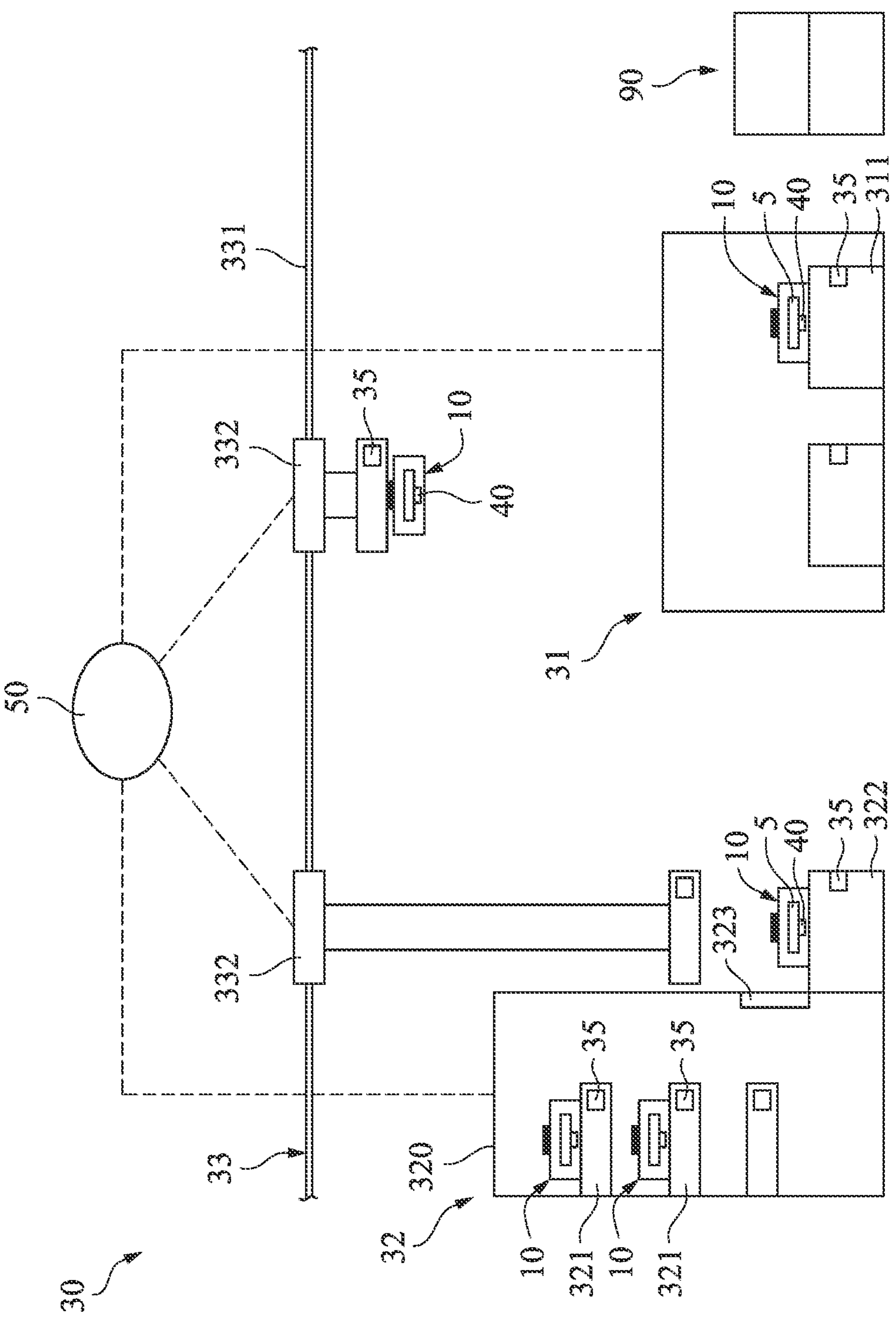
FIG. 2 is a schematic view of partial elements of a fabrication facility in accordance with some embodiments of the present disclosure.

Reference is made to FIG. 2. FIG. 2 is a schematic view of partial elements of a fabrication facility in accordance with some embodiments of the present disclosure. In some embodiments, the fabrication system 30 includes a lithography exposure apparatus 31, a stocker 32, a transportation apparatus 33 and a number of interface devices 35. The lithography exposure apparatus 31 is configured to perform a lithography process on wafers (not shown in figures). In some embodiments, the lithography exposure apparatus 31 includes a number of load ports 311. The load ports 11 are configured to load reticle carriers 10 for storing one or more reticles 5. The lithography exposure apparatus 31 may be any kind of lithography apparatuses such as immersion scanners, extreme ultraviolet (EUV) scanners, stepper and/or the like.

The stocker 32 is configured to automation storage and retrieval of the reticle carrier 10. In some embodiments, the stocker 32 includes a main body 320, a number of storage shelves 321 and a load port 322. In some embodiments, the main body 320 is a rectangular enclosure, and one or more openable/closeable and sealable access doors 323 are positioned on a side wall of the main body 320. The storage shelves 321 are positioned inside the main body 320 and configured to facilitate the storage of the reticle carriers 10 within the main body 320. The reticle carrier 10 may be transferred by a robotic arm (not shown in figures), and the transportation or the movement of the reticle carrier 10 in the stocker 32 is controlled by the control system 60.

The load port 322 is configured to support and dock the reticle carriers 10 for facilitating the insertion of reticle carriers 10 into, and their subsequent removal from, the main body 320 of the stocker 32. The load port 322 is positioned along a trail assembly 331 of the transportation apparatus 33 (which is described later) so as to receive the reticle carriers 10 transferred from the vehicle of the transportation apparatus 33. The load ports 322 are positioned in such a way that they correspond to the access door 323 of the main body 320 for transferring reticle carriers 10 into the main body 320.

The transportation apparatus 33 is configured to transport or convey the reticle carrier 10 to or from the stocker 32 or the lithography exposure apparatus 31. The transportation apparatus 33 includes a trail assembly 331 and a number of overhead hoist transport (OHT) assemblies 332, in accordance with some embodiments. The trail assembly 331 is mounted on the ceiling of a FAB, for example. The OHT assembly 332 is suspended by the trail assembly 331, and the transportation or the movement of the OHT assembly 332 on the trail assembly 331 is controlled by the control system 60.

The interface devices 35 are positioned in multiple positions of the fabrication system 30 where the reticle carrier 10 may be placed. For example, each of the load ports 311 of the lithography exposure apparatus 31 has an interface device 35 mounted inside. In addition, each of the load ports 322 and each of the shelves 321 of the stocker 32 has an interface device 35 mounted inside. Moreover, each of the OHT assemblies 332 has an interface device 35 mounted inside. Elements of the interface device 35 will be described in more detail later with reference to FIG. 4.

Figure 3A:
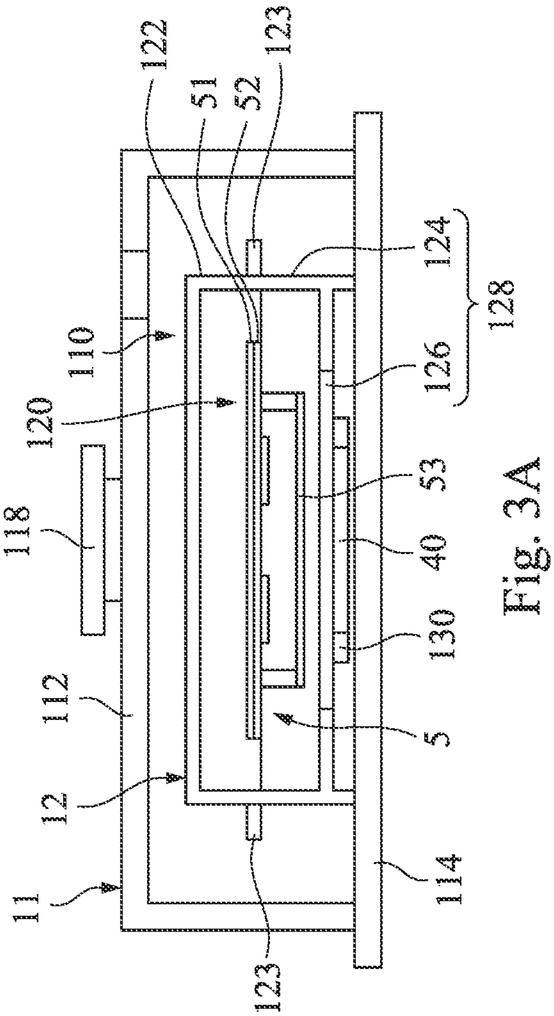
FIGS. 3A and 3B are schematic views of a reticle carrier in accordance with some embodiments of the present disclosure.
Figure 3B:
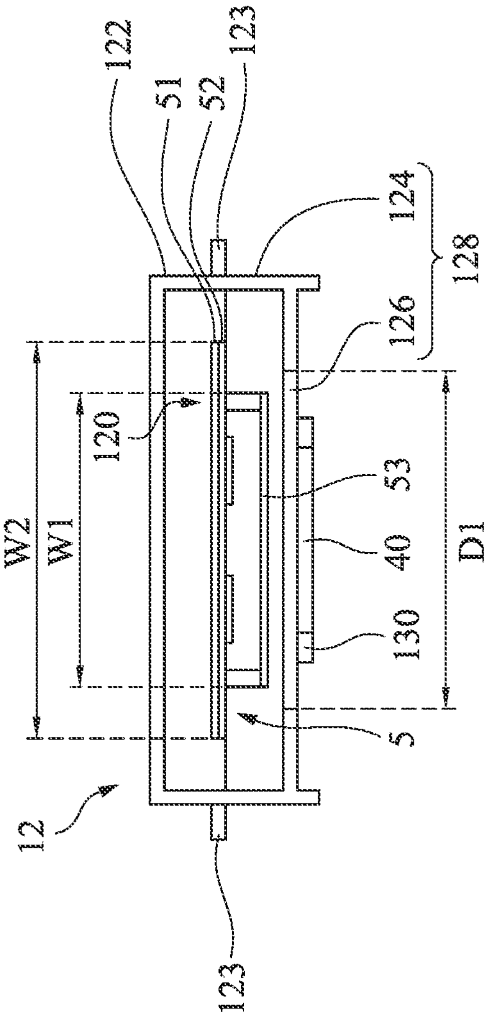
Figure 3D:
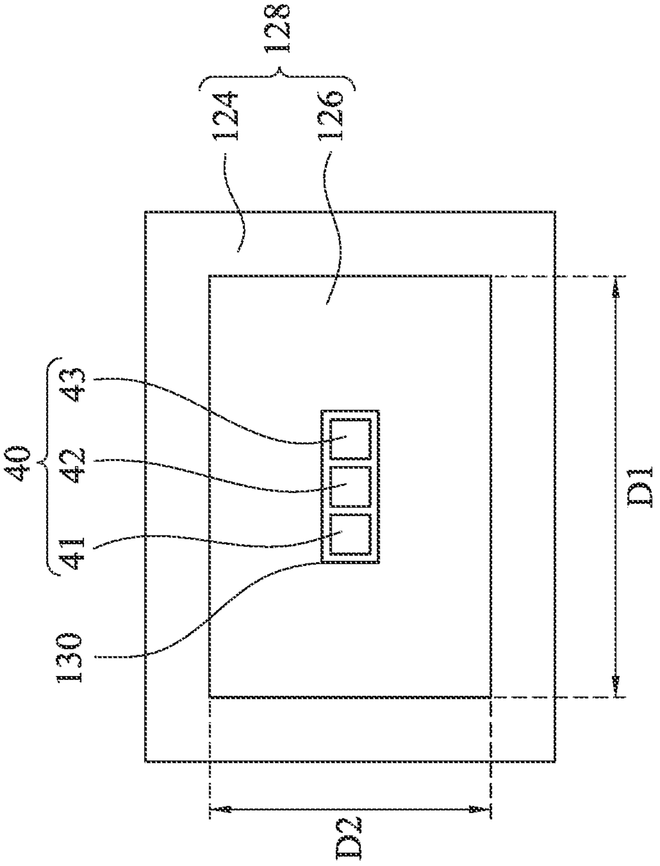
FIGS. 3C and 3D are a perspective view and a top view of an inner pod of a reticle carrier with a sensor in accordance with some embodiments of the present disclosure.
Figure 3C:
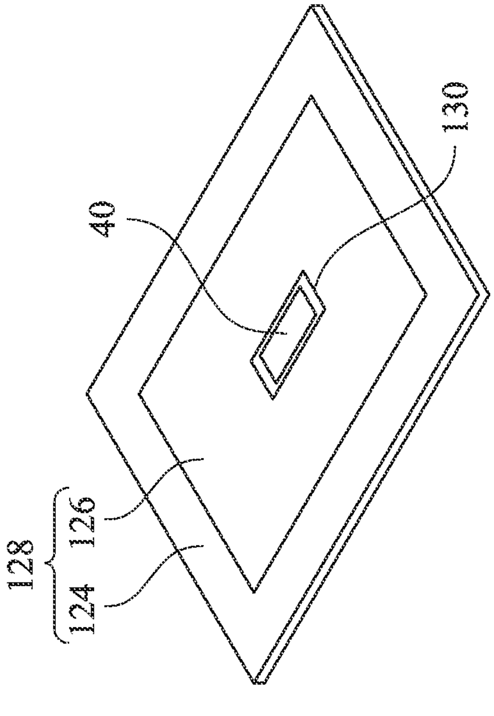

Reference is made to FIGS. 3A, 3B, 3C, and 3D. FIGS. 3A and 3B are schematic views of a reticle carrier in accordance with some embodiments of the present disclosure. FIGS. 3C and 3D are a perspective view and a top view of an inner pod of a reticle carrier with a sensor in accordance with some embodiments of the present disclosure. As shown in FIG. 3A, a reticle carrier 10 is with a reticle 5 positioned therein. In some embodiments, the reticle 5 is a reflective mask. One exemplary structure of the reticle 5 may include a substrate 51 of a suitable material, such as a low thermal expansion material (LTEM) or fused quartz. The reticle 5 may further include a reflective multilayer 52 deposited on the substrate 51. The reflective multilayer 52 includes suitable materials, such as molybdenum-silicon (Mo/Si) film pairs, that are configurable to highly reflect the EUV light. The reticle 5 also includes a pellicle 53. The pellicle 53 is configured to prevent contaminant particles from landing on the substrate 51 and degrading the result of photolithography process (e.g., by keeping contaminant particles away from a plane of focus of the substrate 51). The pellicle 53 may be made of a thin film transparent to the radiation beam used in a lithography patterning process, and furthermore has a thermal conductive surface. In some embodiments, the pellicle 53 may be made of, carbon nanotube, boron carbide, Si, C, SiC, SiN, SiO2, SiON, Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, another suitable material, or a combination thereof. In some embodiments, the pellicle 53 may have a thickness in a range from about 10 nm to about 100 nm (e.g., such as about 10, 20, 30, 40, 50, 60, 70, 80, 90, or 100 nm).

In some embodiments, the reticle carrier 10 includes an outer pod 11. The outer pod 11 includes a top cover portion 112 and a bottom cover portion 114. The top cover portion 112 and the bottom cover portion 114 define a space 110. In some embodiments, the outer pod 11 also includes a grip element 118 affixed to the top cover portion 112 so that the OHT assembly 332 can easily carry the outer pod 11 (FIG. 2). In some embodiments, the reticle carrier 10 has a dual pod design and includes various other portions and features. The reticle carrier 10 further includes an inner pod 12. The inner pod 12 is configured so that the outer pod 11 can fit around the inner pod 12. In some embodiments, the inner pod 12 has a cover 122 and a base plate 128. The cover 122 and the base plate 128 define a space 120. When the retile 5 is positioned in the reticle carrier 10, the inner pod 12 is located in the outer pod 11, and the reticle 5 is located in the inner pod 12. As a result, further protection for the reticle 5 is provided. In some embodiments, the cover 122 has a pair of flanges 123 formed on two opposite side walls. The functions of the flanges 123 will be described in more detail later with reference to FIG. 9.

The base plate 128 of the inner pod 12 includes a peripheral portion 124 and a central portion 126. In some embodiments, the peripheral portion 124 may be in a rectangular shape and have a rectangular external shape having a rectangular opening at its center from a top view. In some embodiments, the central portion 126 may be in a rectangular shape to fit the rectangular opening of the peripheral portion 124 from the top view. As shown in FIGS. 3B and 3D, the central portion 126 may have a first dimension D1 extending in a first direction and in a range from about 100 to 200 nm (e.g., 100, 120, 140, 150, 152, 160, 180 or 200 nm). In FIG. 3D, the central portion 126 may have a second dimension D2 extending in a second direction perpendicular to the first direction and in a range from about 100 to 200 nm (e.g., 100, 120, 140, 150, 152, 160, 180 or 200 nm). The central portion 126 may be transparent and may be made of a material, such as quartz. In FIG. 3B, the first dimension D1 of the central portion 126 of the base plate 128 may be greater than a width W1 of the pellicle 53. In some embodiments, the first dimension D1 of the central portion 126 of the base plate 128 may be less than a width W2 of the reflective multilayer 52.

Figure 4:
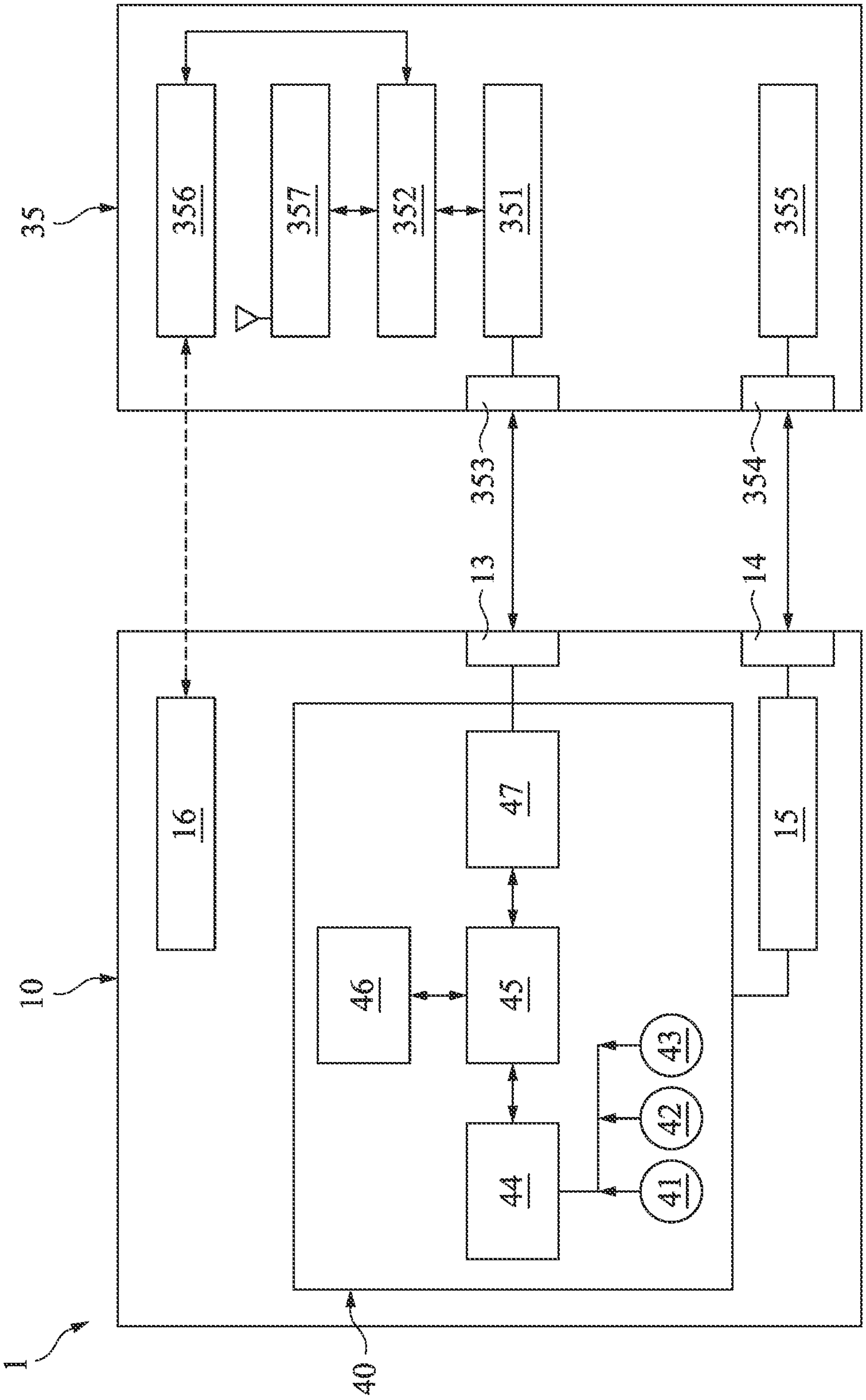
FIG. 4 is a block diagram of partial elements of a fabrication facility in accordance with some embodiments of the present disclosure.

During lithography processes, the reticle 5 may experience various kinds of movement that could deform, distort, wrinkle, rupture, tear, break the pellicle or other types of damage to the pellicle 5, since it is a thin membrane, thereby rendering the mask pellicle system unusable. Therefore, the present disclosure provides the metrology device 40 positioned on a bottom surface of the central portion 126 of the base plate 128 and configured to detect one or more pellicle conditions over the retile 5. In other words, the metrology device 40 is positioned at an outside of the inner pod 12. The metrology device 40 can be mounted on the base plate 128 through a support structure 130. In some embodiments, as shown in FIG. 4, the metrology device 40 may include one or more sensors (e.g. sensors 41, 42, 43) configured to detect one or more pellicle conditions (e.g., deformation, distortion, wrinkle, rupture, tear, broken). The multiple sensors 41, 42, 43 allow different types of data associated with pellicle conditions to be collected simultaneously. Since the pellicle conditions in the inner pod 12 are measured, the health of the reticle 5 can be monitored. Therefore, the present disclosure in various embodiments provides a method for monitoring one or more pellicle conditions of the reticle 5 during the transferring of the reticle 5 without opening the cover 122 of the inner pod 12, which in turn reduces the risk of pellicle damagement and real-time monitors pellicle status during the transferring of the reticle 5.

Reference is made to FIG. 4. FIG. 4 is a block diagram of partial elements of a fabrication facility in accordance with some embodiments of the present disclosure. In some embodiments, each of the sensors 41, 42, and/or 43 in the metrology device 40 may include a signal converter 44, a processor 45, a storage device 46 and an input and output (I/O) controller 47. The signal converter 44 receives the output of the sensors 41, 42, and/or 43 as input. In some embodiments, the signal converter 44 includes a multichannel analog-to-digital converter, and each channel is capable of converting the analog signal output from one of the sensors 41, 42, and/or 43 into digital form. In some embodiments where the sensors 41, 42, and/or 43 output digital signals, the signal converter 44 may perform the data processing on the digital signal outputs of the sensors 41, 42, and/or 43. The signal converter 44 then outputs the data associated with pellicle conditions to an input of the processor 45, which performs further processing on the data. In some embodiments, the processor 45 controls the operations of the signal converter 44 and the I/O controller 47. In some embodiments, the signal converter 44 is integrated into the processor 45. The processor 45 can communicate with the storage device 46. For example, data associated with pellicle conditions can be transferred between the storage device 46 and the processor 45 to enhance the functionality of the processor 45. The storage device 46 may be any form of memory, including Flash, Memory Stick, Micro-SD, or a hard disk. In some embodiments, the storage device 46 may be integrated into the processor 45. The I/O controller 47 is operatively coupled to the processor 45. The I/O controller 47 may be integrated with the processor 45 or it may be a separate component as shown. The I/O controller 47 is generally configured to control interactions with one or more interface devices 35 that can be coupled to the reticle carrier 10. The I/O controller 47 generally operates by exchanging data between the metrology device 40 and the interface devices 35 that desire to communicate with the metrology device 40. In some cases, the interface devices 35 may be connected to the I/O controller 47 through wired connections and in other cases the interface devices 35 may be connected to the I/O controller 47 through wireless connections, such as WIFI, 3G, 4G, LTE, 5G, or bluetooth.

In some embodiments, the interface device 35 is capable of being connected to the I/O controller 47 of the sensor 41, sensor 42, and/or sensor 43 through a wired connection. As shown in FIG. 4, the reticle carrier 10 may include a data connector 13 coupled to the I/O controller 47 of the sensor 41, sensor 42, and/or sensor 43. The data connector 13 is capable of connecting to a corresponding a data connector 353 and a transceiver 351 located within the interface device 35, and the data connector 13 is configured to engage the data connector 353 so as to provide data transmissions to and from the metrology device 40. In some embodiments, the reticle carrier 10 may include a power connector 14. The power connector 14 of the reticle carrier 10 is operatively coupled to a battery 15 of the reticle carrier 10. The power connector 14 is configured to engage a power connector 354 and a power supply circuit 355 of the interface device 35 so as to provide charging power to the battery 15. The battery 15 is then provide operational power to the metrology device 40. The data connectors 13/353 and the power connectors 14/354 may vary widely. For example, they may be configured to provide one or more data (or power) transmitting functions including USB, USB 2.0, Ethernet, and the like. In some embodiments, the interface device 35 may further include a processor 352, a transceiver 357, and a code reader 356. In some embodiments, the reticle carrier 10 may further include a carrier identification 16, such as a RFID tag. The carrier identification 16 wirelessly transmits signals with various information on the reticle carrier 10 to the code reader 356, including, but not limited to, the identity of the reticle 5 contained in the reticle carrier 10. The code reader 356 then outputs the data of the reticle carrier 10 to an input of the processor 352. The processor 352 may perform further processing on the data from the code reader 356 and the transceiver 351 and outputs the processed data to the transceiver 357 for data transmission to the FDC system 50 or the control system 60 via an antenna 358 (see FIG. 1). For example, the processor 352 matches the carrier identity from the carrier identification 16 with the metrology data from the metrology device 40, so that the FDC system 50 can reorganize the metrology data is sent from which reticle carrier 10. Therefore, the information of the reticle carrier 10 including the pellicle conditions within the reticle carrier 10 can be processed by the FDC system 50 or the control system 60.

Referring back to FIG. 1, the FDC system 50 evaluates conditions in the reticle carrier 10 to detect abnormalities or faults, such as pellicle condition change in the reticle carrier 10, by monitoring the data associated the pellicle conditions in the reticle carrier 10 before, during, and after the transportation process. In some embodiments, an abnormality is indicated when the pellicle condition varies (higher or lower) significantly from the expected pellicle condition determined, for example, by archival data stored in the archive database 70. Such abnormalities may indicate that there is a fault with the reticle carrier 10. For example, damage to the pellicle 53 may cause the reflection intensity of the pellicle 53 to vary from the expected reflection intensity. In some embodiments, the FDC system 50 implements statistical process control (SPC) to track and analyze the condition of the reticle carrier 10. For example, the FDC system 50 may implement SPC charts that document historical data of the reticle carrier 10 by charting SPC data associated with the process over time. Such SPC data includes parameters associated with the location of the reticle carrier 10. When the SPC data indicates that parameters have departed from a range of acceptable values (in other words, when the FDC system 50 detects a fault or abnormality), the FDC system 50 triggers a warning to the control system 60 and/or notifies an engineer or operator of the fabrication system 30, so that any fault with the reticle carrier 10 may be identified and remedied.

In FIG. 1, the control system 60 can implement control actions in real time, wafer-to-wafer, lot-to-lot, or a combination thereof. In some embodiments, the control system 60 implements control actions to control the operation status of the fabrication system 30. For example, the control system 60 (based on a warning from the FDC system 50) shuts down the operation of the lithography exposure apparatus 31 so as to stop the process being performed in the lithography exposure apparatus 31. In some embodiments, the control system 60 implements control actions to actuate the transportation apparatus 33 to move the reticle carrier 10 to a maintenance station 90 for maintenance. In some embodiments, the control system 60 implements control actions to modify process recipe performed by the lithography exposure apparatus 31 (see FIG. 2). For example, the control system 60 (based on inline metrology data from the metrology device 40) modifies the predetermined process recipe (specifically, the parameters implemented by the lithography exposure apparatus 31 (see FIG. 2), such as process time, flow rate of gas, chamber pressure, chamber temperature, wafer temperature, or other process parameters) for each reticle to ensure that each reticle located in the lithography exposure apparatus 31 exhibits the targeted characteristics.

In FIG. 1, the archive database 70 may include a number of storage devices to provide information storage. The information may include raw data obtained directly from the metrology device 40, as well as information from the fabrication system 30. For example, the information from the metrology device 40 may be transferred to the archive database 70 and stored in the archive database 70 for archival purposes. The data from the metrology device 40 may be stored in its original form (e.g., as it was obtained from the metrology device 40 or the fabrication system 30) and it may be stored in its processed form (e.g., converted to a digital signal from an analog signal). The archive database 70 stores data associated with the fabrication facility 1, and particularly data associated with the pellicle conditions over the reticle 5. In some embodiments, the archive database 70 stores data collected from the fabrication system 30, the metrology device 40, the FDC system 50, the control system 60, another entity 80, or a combination thereof. For example, the archive database 70 stores data associated with wafer characteristics of wafers processed by the fabrication system 30 (such as that collected by the metrology device 40 as described below), data associated with parameters implemented by the fabrication system 30 to process such wafers, data associated with analysis of the wafer characteristics and/or parameters of the FDC system 50 and the control system 60, and other data associated with the fabrication facility 1. In some embodiments, the fabrication system 30, the metrology device 40, the control system 60, the FDC system 50, and the other entity 80 may each have an associated database.

Referring back to FIGS. 3A, 3B, 3C, and 3D, in some embodiments, the sensor 41 in the metrology device 40 may be an image sensor. The image sensor 41 may captures an image of the pellicle 53 before, during, and after the transportation process. The processor 45 is connected to the image sensor 41 to receive the captured image from the image sensor 41 before, during, and after the transportation process. Subsequently, the processor 45 may compare the captured image of the pellicle 53 to a corresponding reference image (e.g., a reference image of a non-broken pellicle) stored in the storage device 46 and thus produce a comparison result showing the differences between the two, and then sends the comparison result to the control system 60. The comparison result can be used to determine pellicle conditions (e.g. broken or non-broken of the pellicle 53). If the comparison result of the pellicle conditions exceeds the range of acceptable values, an alarm condition will be indicated. In some embodiments, the image sensor 41 has a field of view (FOV) covering the pellicle 53, so that the image sensor 41 can capture an image of the pellicle 53. In some embodiments, the image sensor 92 may include a CPU (CCD), wireless camera, or other suitable devices.

Figure 3E:
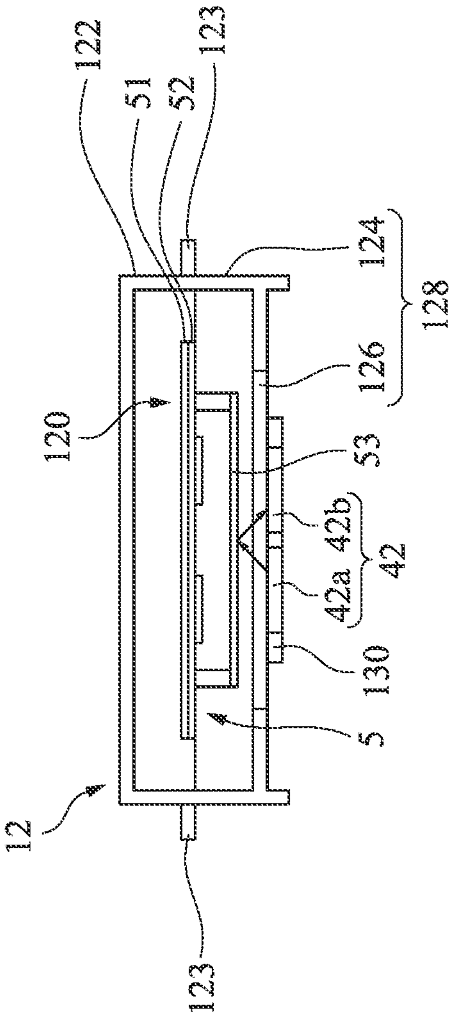
FIGS. 3E and 3F are schematic views of a reticle carrier with sensors in accordance with some embodiments of the present disclosure.

In some embodiments, the sensor 42 in the metrology device 40 may be a distance sensor (e.g., rangefinder). Reference is made to FIG. 3E. FIG. 3E is a schematic view of a schematic view of a reticle carrier with a distance sensor 42 in accordance with some embodiments of the present disclosure. In some embodiments, the distance sensor 42 may include a light emitting unit 42*a* and a light receiving unit 42*b*, the light emitting unit 42*a* may emit a light beam toward the reticle 5, and the light beam arriving at the reticle 5 may be reflected by the reticle 5, so as to propagate toward the light receiving unit 42*b*. Subsequently, the reflected first light beam may be received by the light receiving unit 42*b* after a time interval. By analyzing the time interval, the distance sensor 42 may measure a distance from the distance sensor 42 to the reticle 5 before, during, and after the transportation process. The processor 45 is connected to the distance sensor 42 to receive the measured distance from the distance sensor 42 before, during, and after the transportation process. Subsequently, the processor 45 may compare the measured distance to a corresponding reference distance (e.g., a reference image of a non-broken pellicle) stored in the storage device 46 and thus produce a comparison result showing the differences between the two, and then sends the comparison result to the control system 60. The comparison result can be used to determine pellicle conditions (e.g. broken or non-broken of the pellicle 53). For example, if the pellicle 53 is broken, the light emitting unit 42*a* may emit a light beam toward the reflective multilayer 52, not the pellicle 53, and the light beam arriving at the reflective multilayer 52 may be reflected by the reflective multilayer 52, so as to propagate toward the light receiving unit 42*b*. Therefore, the reflected first light beam may be received by the light receiving unit 42*b* after a longer time interval than a reference time interval, such that a distance difference of the comparison result may exceed the range of acceptable values, and then an alarm condition will be indicated.

Figure 3F:
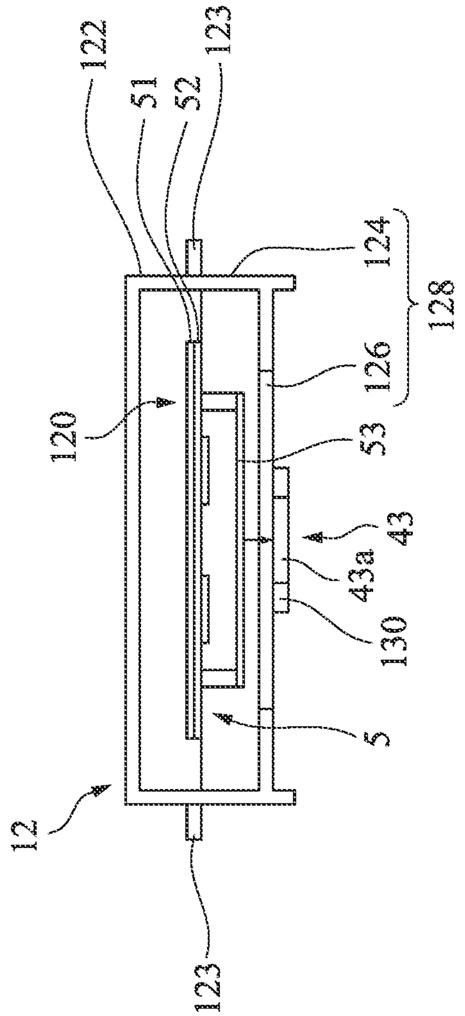
Figure 3G:
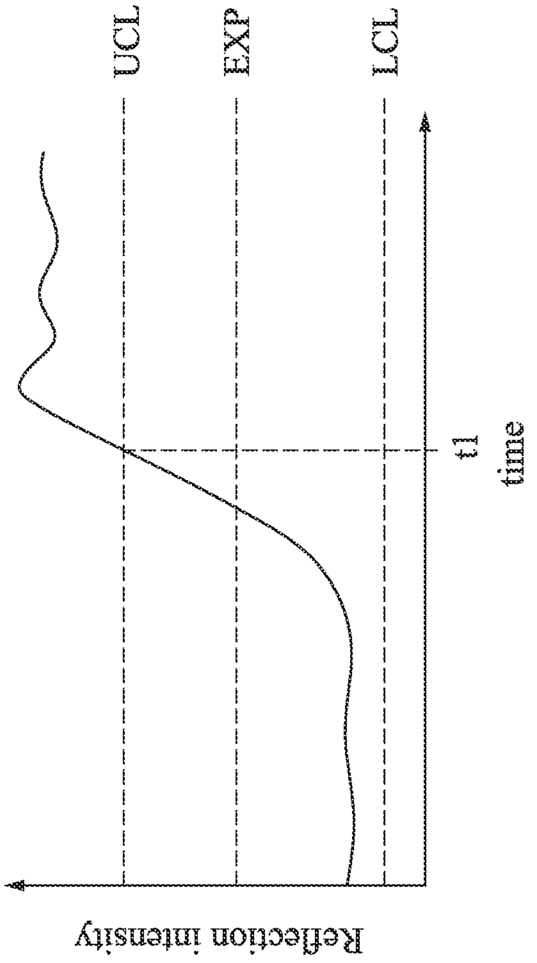
FIG. 3G is a diagram plotting measured reflection intensity on pellicle over a reticle versus time with a distance sensor in accordance with some embodiments of the present disclosure.

In some embodiments, the sensor 43 in the metrology device 40 may be a light intensity sensor. Reference is made to FIGS. 3F and 3G. FIG. 3E is a schematic view of a schematic view of a reticle carrier with a light intensity sensor 43 in accordance with some embodiments of the present disclosure. FIG. 3F is a diagram plotting measured reflection intensity on pellicle over a reticle versus time with the light intensity sensor 43 in accordance with some embodiments of the present disclosure. The light intensity sensor 43 has a light receive unit 43*a* facing toward the reticle 5. The light receive unit 43*a* faces toward the reticle 5 to receive the optical signal from the reticle 5, and detect the light intensity of the optical signal. In some embodiments, the light intensity sensor 43 may be, but not limited to be, light-sensitive devices such as a phototransistor, a photodiode, an optical fiber pressure sensor or other suitable components. By detecting the light intensity of the optical signal from the reticle 5, the metrology device 40 may detect whether the pellicle 53 is broken or non-broken. For example, if the pellicle 53 is broken, the light receive unit 43*a* may receive the optical signal from the reflective multilayer 52, not the pellicle 53, and detect the light intensity of the optical signal of the reflective multilayer 52. Therefore, the optical signal from the reflective multilayer 52 may be stronger than a reference optical signal, such that a light intensity difference of the comparison result may exceed the range of acceptable values, and then an alarm condition will be indicated.

Specifically, before analyzing the detected data in T-chart shown in FIG. 3G associated with the reticle 5, a range of acceptable values for the measured pellicle conditions is determined. The range of acceptable values for the measured pellicle conditions may be a standard deviation from an expected value. For example, as shown in FIG. 3G, an upper control limit (UCL) is set at the expected humidity (EXP) plus one standard deviation of the comparison result, and lower control limits (LCL) are set at the expected humidity (EXP) minus one standard deviation of the comparison result. The difference between the UCL and LCL at a specific time is referred to as the range of acceptable values. In some embodiments, the range of acceptable values is determined by the position where the reticle carrier 10 is located, because the expected pellicle conditions vary accordingly. After the range of acceptable values for the measured pellicle conditions is determined, the FDC system 50 (see FIG. 1) analyzes the measured pellicle conditions to determine if the measured pellicle conditions are within the acceptable range. After the analysis, if the measured pellicle conditions are within the range of acceptable values, the method repeats measuring pellicle condition and determining whether the measured pellicle condition is within a range of acceptable value until the predetermined period for monitoring the pellicle 53 is finished. However, if the measured pellicle conditions exceed the range of acceptable values, an alarm condition will be indicated.

Figure 3I:
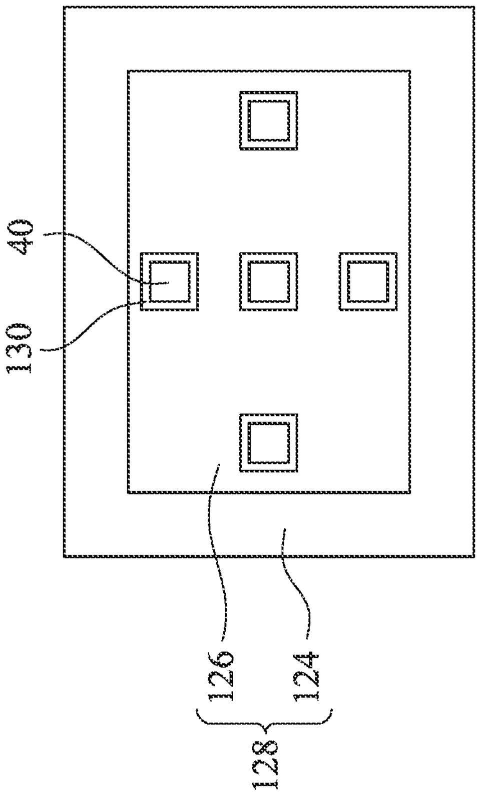
FIGS. 3H-3J are schematic views of configurations of sensors on an inner pod of a reticle carrier in accordance with some embodiments of the present disclosure.
Figure 3J:
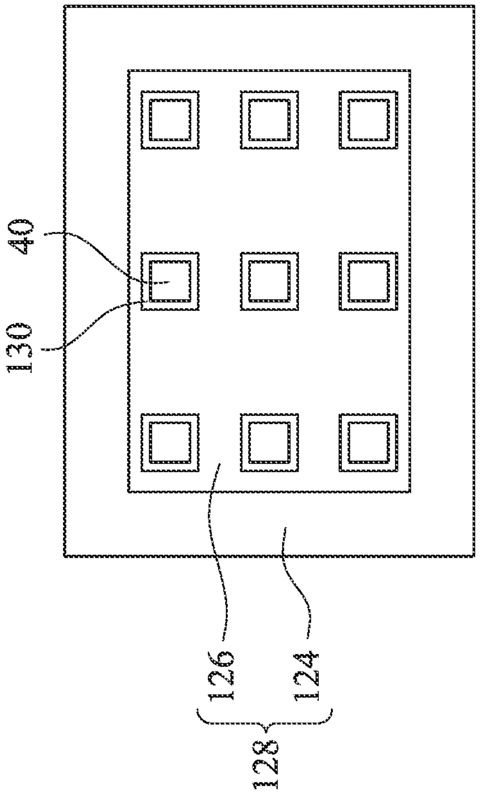
Figure 3H:
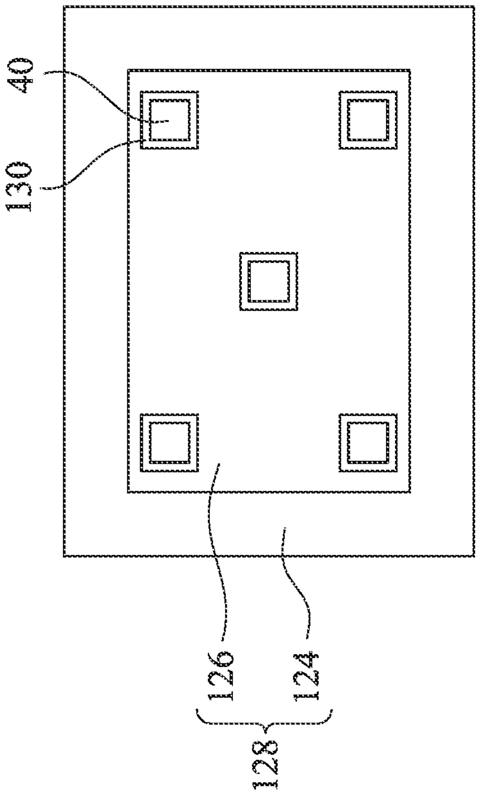

Reference is made to FIGS. 3H-3J. FIGS. 3H-3J are schematic views of configurations of sensors on an inner pod of a reticle carrier in accordance with some embodiments of the present disclosure. In some embodiments, material and manufacturing method of elements of the present embodiments are substantially the same as those of the elements as shown in FIGS. 3A to 3G, and the related detailed descriptions may refer to the foregoing paragraphs, and are not described again herein. The difference between the present embodiments and the embodiment in FIGS. 3A to 3G are that a number of the metrology device 40 mounted on the base plate 128 may be plural and has a different metrology device configuration. Other embodiments may contain more or fewer metrology devices and have different metrology device configuration than the embodiment in FIGS. 3H to 3J. As shown in FIG. 3H, there are five metrology devices 40 mounted on the base plate 128 of the inner plate 12. One of the metrology devices 40 is positioned at a center of the central portion 126 of the base plate 128, and others are respectively positioned at four corners of the central portion 126. As shown in FIG. 3I, there are five metrology devices 40 mounted on the base plate 128 of the inner plate 12. One of the metrology devices 40 is positioned at the center of the central portion 126 of the base plate 128, and others are respectively positioned to arrange along four edges of the central portion 126. As shown in FIG. 3J, there are nine metrology devices 40 mounted on the base plate 128 of the inner plate 12. One of the metrology devices 40 is positioned at the center of the central portion 126 of the base plate 128, and others are respectively positioned at four corners of the central portion 126 and along four edges of the central portion 126.

Figure 5:
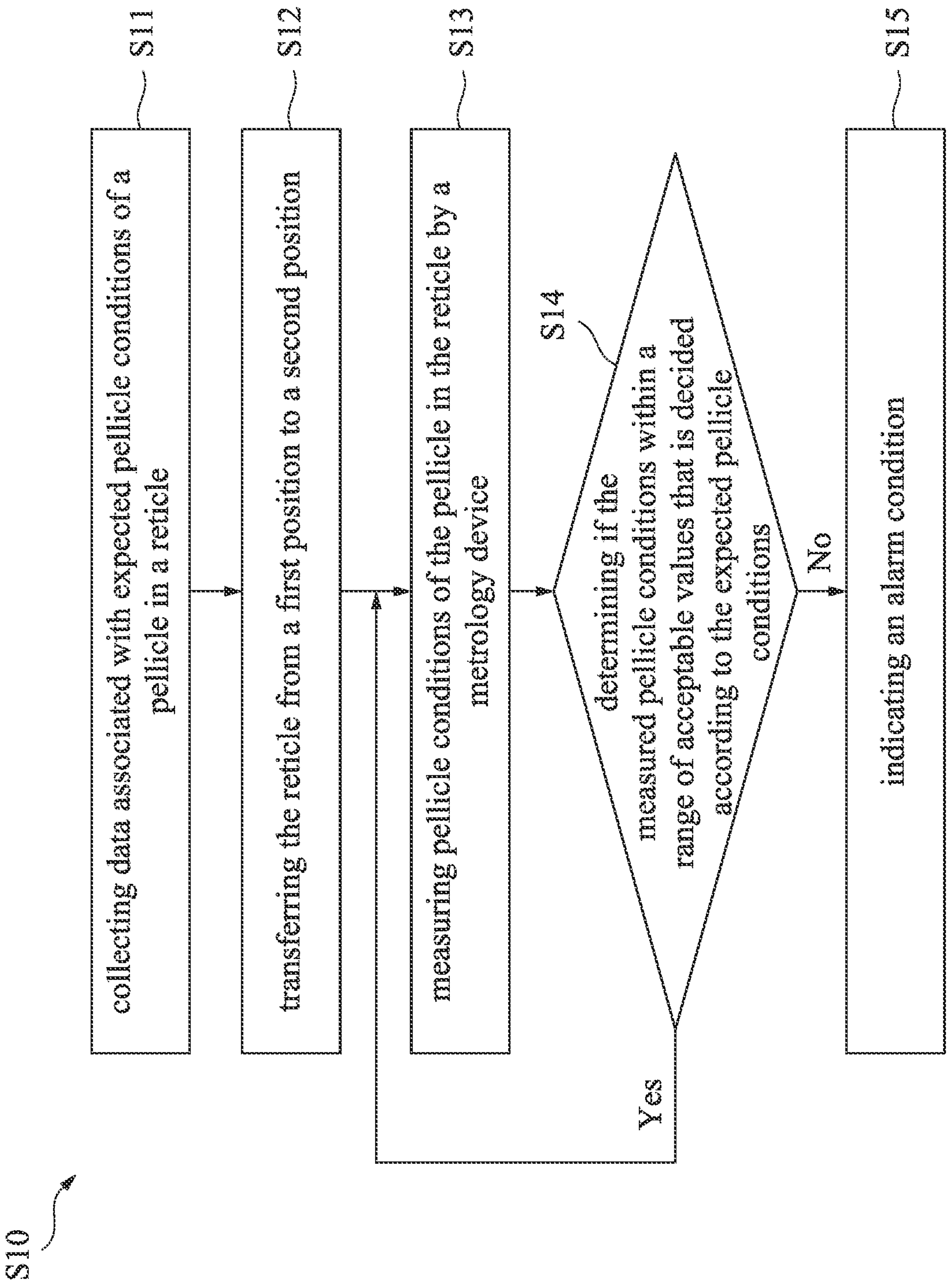
FIG. 5 is a flowchart of a method of enabling fault detection on a pellicle over a reticle in accordance with some embodiments of the present disclosure.

Reference is made to FIG. 5. FIG. 5 is a flowchart of a method of enabling fault detection on a pellicle over a reticle 10 in accordance with some embodiments of the present disclosure. For illustration, the flow chart will be described along with the drawings shown in FIGS. 1, 2, and 4. Some of the described stages can be replaced or eliminated in different embodiments.

The method S10 includes operation S11, in which data associated with the expected pellicle conditions in the reticle carrier 10 containing one or more reticles 5 is collected. The data associated with the expected pellicle conditions in the reticle carrier 10 may be in the form of a range of values within which it has been observed that normal conditions in the reticle carrier 10 consistently occur. In some embodiments, the data is retrieved from the archive database 70 and sent to the FDC system 50. In some embodiments, the data is applied to the FDC system 50 by engineering or processing knowledge. In some embodiments, the data associated with the expected pellicle conditions in the reticle carrier 10 in different positions of the fabrication system may be different. For example, an image or an reflection intensity in a position where the load port 322 of the stocker 32 is located may be different from an image or an reflection intensity in the position of the load port 311 of the lithography exposure apparatus 31. Therefore, the data associated with the expected image or reflection intensity when the reticle carrier 10 is positioned on the load port 322 is different from the data associated with the expected image or reflection intensity when the reticle carrier 10 is positioned on the load port 311.

The method S10 also includes operation S12, in which the reticle carrier 10 is transferred from an original position to a destination position. In some embodiments, the reticle carrier 10 is moved by the transportation apparatus 33 between the stocker 32 and the lithography exposure apparatus 31. Therefore, either the original position or the destination position is the stocker 32, and the other of either the original position or the destination position is the lithography exposure apparatus 31. In some embodiments, the reticle carrier 10 is moved between the load port 322 of the stocker 32 and one of the shelves 321 of the stocker 32. In some embodiments, the reticle carrier 10 is moved between the load port 311 of the lithography exposure apparatus 31 and a position in the lithography exposure apparatus 31 where the reticle 5 may be subjected to exposure light.

The method S10 also includes operation S13, in which pellicle conditions in the reticle carrier 10 are measured by the metrology device 40. In some embodiments, the pellicle conditions in the reticle carrier 10 are measured during the transfer of the reticle 5. For example, the measurement of the pellicle conditions in the reticle carrier 10 is initiated once the reticle carrier 10 is removed from the shelf 321 in the stocker 32, and the measurement of the pellicle conditions in the reticle carrier 10 is terminated once the reticle 5 is removed from the reticle carrier 10 which is placed on the load port 311. In some embodiments, the measurement of the pellicle conditions in the reticle carrier 10 is executed while the reticle 5 is stored in the stocker. In some embodiments, the measurement of the pellicle conditions in the reticle carrier 10 is executed periodically when the reticle carrier 10 is coupled to the interface devices 35 in the fabrication system 30. For example, during the movement of the reticle carrier 10 from the shelf 321 to the load port 322 of the stocker 32, the metrology device 40 will not start monitoring the pellicle conditions in the reticle carrier 10 until the reticle carrier 10 is placed on the load port 322. In addition, during the stay of the reticle carrier 10 on the load port 322, the measurement of the pellicle conditions in the reticle carrier 10 is executed multiple times at regular time intervals. The detected data associated with the pellicle conditions in the reticle carrier 10 is transmitted in real time to the FDC system 50 via the interface devices 35.

However, it should be appreciated that many variations and modifications can be made to embodiments of the disclosure. The measurement of the pellicle conditions in the reticle carrier 10 may be executed continuously no matter whether the reticle carrier 10 is engaged with the interface devices 35 or not. The detected data associated with the pellicle conditions in the reticle carrier 10 is stored in the storage device 46 of the metrology device 40 and sent to the FDC system 50 when the reticle carrier 10 is coupled to one of the interface devices 35. Alternatively, the detected data associated with the pellicle conditions in the reticle carrier 10 is transmitted to the FDC system 50 in real time through wireless connections. In some embodiments, the measurement of the pellicle conditions in the reticle carrier 10 is executed even during the removal of the reticle 5. For example, once the reticle carrier 10 is placed on the load port 311 of the lithography exposure apparatus 31, the reticle 5 is removed from the reticle carrier 10 by a robot arm (not shown in figures) and moved to an interface module in the lithography exposure apparatus 31. At this time, since the interior (such as the space 110) of the reticle carrier 10 communicates with the interior of the lithography exposure apparatus 31, the metrology device 40 can be used to detect pellicle conditions of the reticle 5 in the lithography exposure apparatus 31.

The method S10 also includes operation S14, in which the data associated with the measured pellicle conditions produced in operation S12 is compared with data associated with the expected pellicle conditions collected in operation S11. In some embodiments, the measured pellicle conditions obtained in operation S12 is compiled in a time-series chart (T-chart) as shown in FIG. 3G, and the T-chart is analyzed by the FDC system 50.

Figure 6:
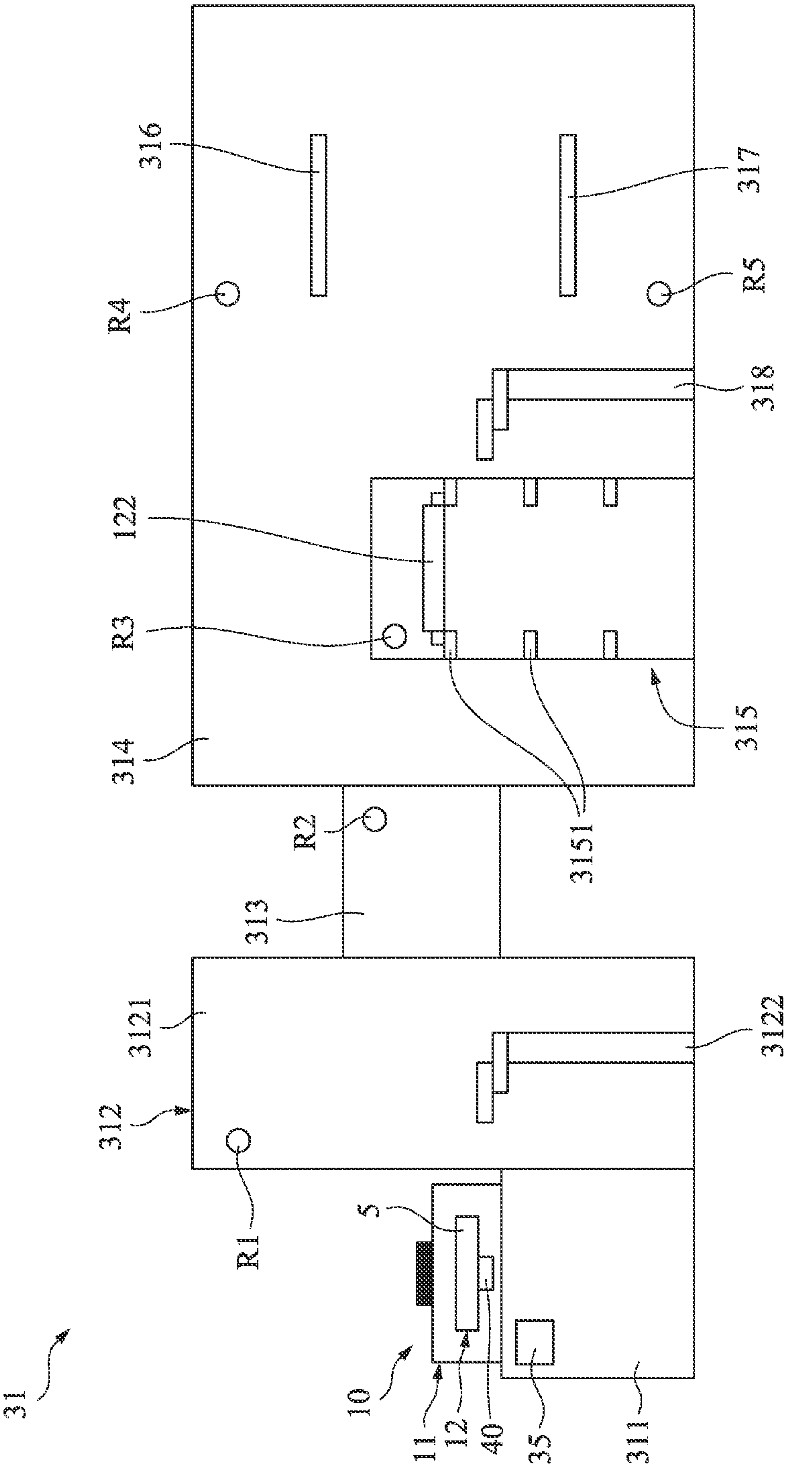
FIG. 6 is a schematic view of a lithography exposure apparatus in accordance with some embodiments of the present disclosure.
Figure 7:
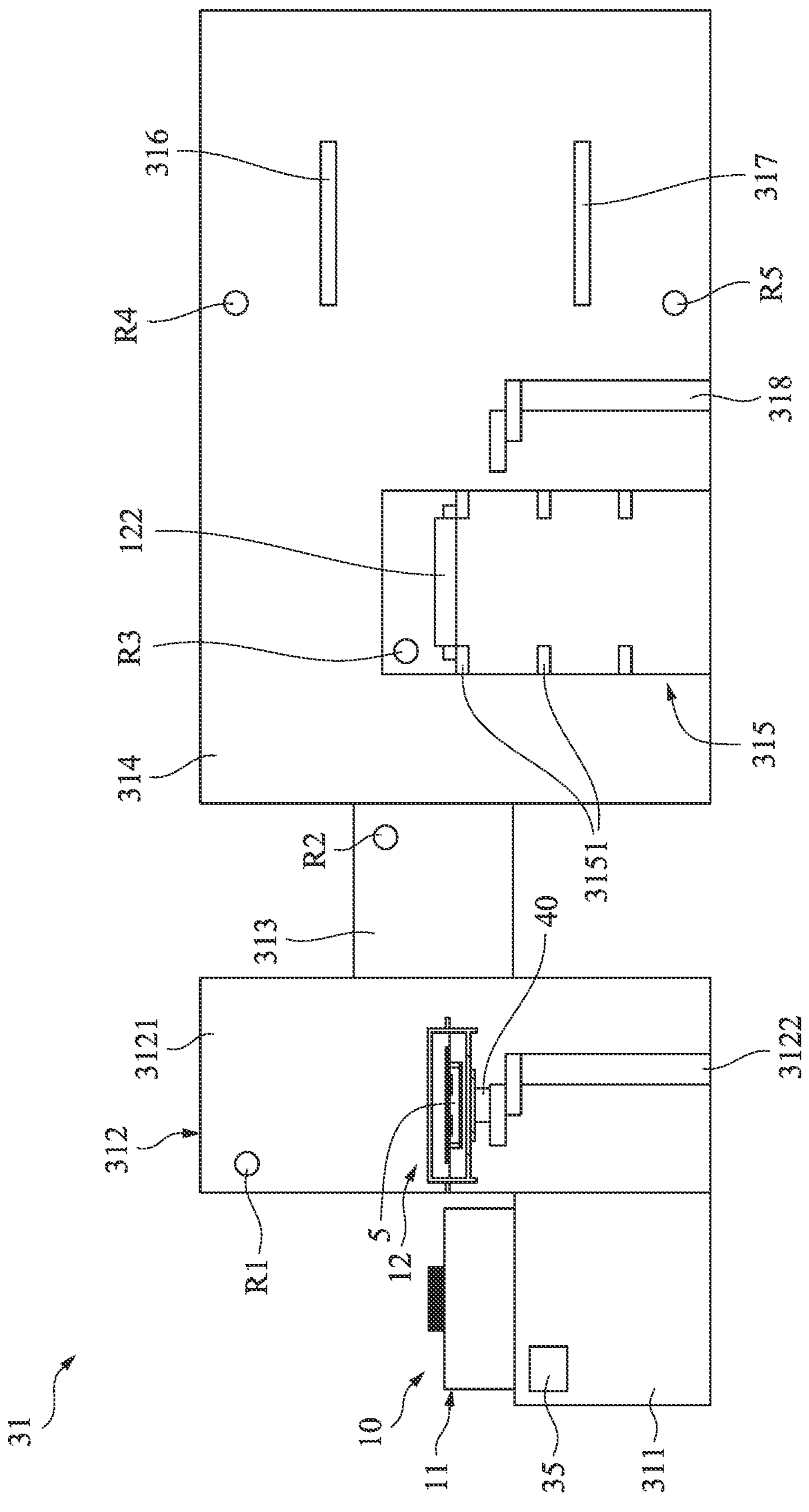
FIG. 7 shows a schematic view of one stage of a method for transporting a reticle in a lithography exposure apparatus as the reticle is positioned over a load port in accordance with some embodiments of the present disclosure.

In some embodiments, the flow chart of FIG. 5 will be described along with the drawings shown in FIGS. 6-11. Some of the described stages can be replaced or eliminated in different embodiments. FIG. 6 is a schematic and diagrammatic view of a lithography exposure apparatus 31 in accordance with some embodiments of the present disclosure. In some embodiments, the lithography exposure apparatus 31 includes the load port 311, an interface module 312, a load lock chamber 313, a vacuum vessel 314, a cover handling chamber 315, a reticle chuck 316, a reticle exchanging station 317, and a transfer mechanism 318. It should be appreciated that the features described below can be replaced or eliminated in other embodiments of the lithography exposure apparatus 31. The interface module 312 is configured to handle the inner pod 12 from the outer pod 11. The interface module 312 includes a housing 3121, and one or more transferring means such as a robotic arm 3122, in accordance with some embodiments. In some embodiments, the interface module 312 includes an equipment front end module (EFEM). The robotic arm 3122 is disposed within the housing 3121. The robotic arm 3122 is configured for physically transporting the inner pod 12. For example, the robotic arm 3122 may retrieve the inner pod 12 from the outer pod 11 to the housing 3121, or the robotic arm 3122 may transport the inner pod 12 to and from the load lock chamber 313. However, the locations where the robotic arm 3122 may transport the inner pod 12 are not limited by the present embodiment.

The load lock chamber 313 is located between the interface module 312 and the vacuum vessel 314. The load lock chamber 313 is configured for preserving the atmosphere within the vacuum vessel 314 by separating it from the interface module 312. The load lock chamber 313 is capable of creating an atmosphere compatible with the vacuum vessel 314 or the interface module 312, depending on where the loaded inner pod 12 is scheduled to be next. This can be performed by altering the gas content of the load lock chamber 313 by such means as adding gas or creating a vacuum, along with other suitable means for adjusting the atmosphere in the load lock chamber 313. The vacuum vessel 314 preserves a vacuum environment at an ultra-high vacuum pressure. The cover handling chamber 315, the reticle exchanging station 317 and the reticle chuck 316 are positioned in the vacuum vessel 314. The cover handling chamber 315 is configured for storing one or more covers 122 removed from the inner pod 12. In some embodiments, the cover handling chamber 315 includes a number of holding members 3151 for supporting the covers 122 removed from the inner pod 12. The reticle chuck 316 is configured for securing the reticle 5 during the lithography exposure process. In some embodiments, the reticle chuck 316 includes an E-chuck which creates a clamping force by generating an electrostatic field.

The reticle exchanging station 317 is configured to support the base plate 128 of the inner pod 12 before the reticle 5 is secured by the reticle chuck 316 or after the base plate 128 is released from the reticle chuck 316. In some embodiments, the reticle exchanging station 317 is positioned relative to the reticle chuck 316. In some embodiments, the reticle exchanging station 317 is able to be moved by a driving member, such as linear motor (not shown in figures). To place the reticle 5 on a preset position of the reticle chuck 316, an alignment tool (such as a camera, not shown in figures) produces information about the position of the reticle exchanging station 317 and/or the reticle chuck 316, and the reticle exchanging station 317 is moved by using the information from the alignment tool to perform an alignment process on the reticle exchanging station 317 relative to the reticle chuck 316. The transfer mechanism 318 is configured to transfer the inner pod 12 or the base plate 128 of the inner pod 12 (FIG. 4) within the vacuum vessel 314. The transfer mechanism 318 may be elevated, moved leftward and rightward, moved forward and backward, and rotated around the vertical axis so as to transfer the inner pod 12 or the base plate 128 of the inner pod 12 among the load lock chamber 313, the cover handling chamber 315, and the reticle exchanging station 317. In some embodiments, there are a number of signal receivers positioned in the lithography exposure apparatus 31. For example, the signal receivers R1, R2, R3, R4 and R5 are respectively positioned in the housing 3121, in the load lock chamber 313, in the cover handling chamber 315, adjacent to the reticle chuck 316, and adjacent to the reticle exchanging station 317. The signal receivers R1, R2, R3, R4 and R5 are configured to receive data signals transmitted from the metrology device 40 in the inner pod 12 when the inner pod 12 is moved to a nearby position via a wireless connection.

Referring back to FIG. 5, the method S10 proceeds to operation S11, in which data associated with the expected pellicle conditions around the reticle 5 during the transfer in the lithography exposure apparatus 31 is collected. The data associated with the expected pellicle conditions around the reticle 5 may be in the form of a range of values within which it has been observed that normal conditions of the pellicle 53 in the reticle 5 consistently occur. In some embodiments, the data is retrieved from the archive database 70 and sent to the FDC system 50. In some embodiments, the data is applied to the FDC system 50 by engineering or processing knowledge. In some embodiments, the data associated with the expected pellicle conditions on the reticle 5 in different positions of the lithography exposure apparatus 31 may be different. For example, the brightness in the housing 3121 may be different from the brightness in the vacuum vessel 314. Therefore, the data associated with the expected brightness when the reticle 5 is located in the housing 3121 is different from the data associated with the expected brightness when the reticle 5 is located in the vacuum vessel 314.

The method S10 further proceeds to operation S12, in which the inner pod 12 of the reticle carrier 10 which contains a reticle 5 is moved in the lithography exposure apparatus 31. In some embodiments, to perform a lithography exposure process on the reticle 5, the reticle carrier 10 which contains the reticle 5 in the inner pod 12 is placed on the load port 311 of the lithography exposure apparatus 31, as shown in FIG. 6. After the reticle carrier 10 is placed on the load port 311, the inner pod 12 is removed from the outer pod 11 by the robotic arm 3122 and moved toward the load lock chamber 313, in the direction indicated by the arrow in FIG. 7.

Figure 8:
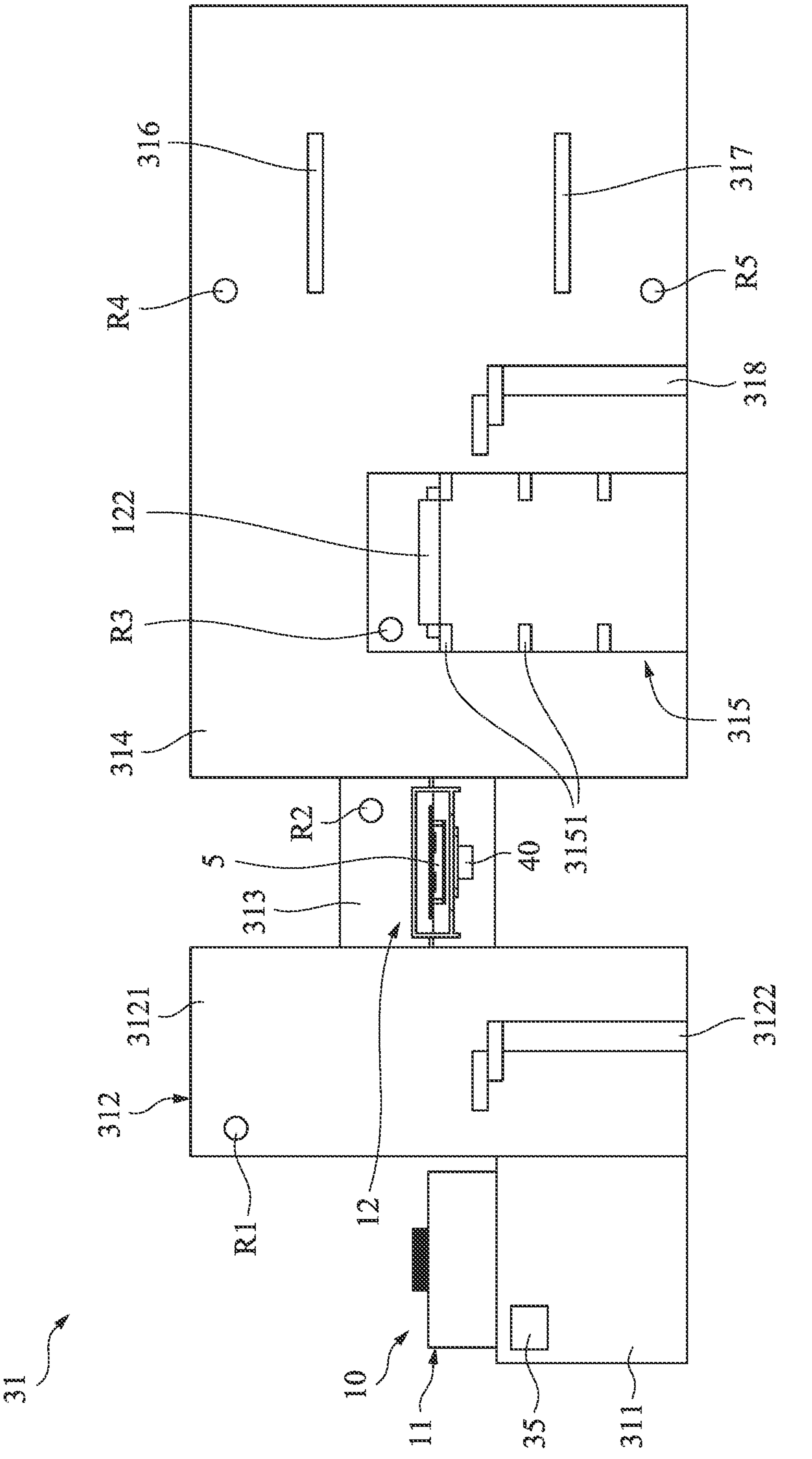
FIG. 8 shows a schematic view of one stage of a method for transporting a reticle in a lithography exposure apparatus as the reticle is positioned in a load lock chamber in accordance with some embodiments of the present disclosure.

When the inner pod 12 is placed in the load lock chamber 12, the robotic arm 3122 returns to the housing 3121, as shown in FIG. 8. At this time, the load lock chamber 313 is sealed and an atmosphere compatible with the vacuum pressure in the vacuum vessel 314 is created by altering the gas content of the load lock chamber 313 by such means as adding gas or creating a vacuum, along with other suitable means for adjusting the atmosphere in the load lock chamber 313. When the correct atmosphere has been reached, the transfer mechanism 318 removes the inner pod 12 from the load lock chamber 313. As a result, the inner pod 12, along with the reticle 5, is moved from an ambient environment (i.e., space in the outer pod 11 and the housing 3121) to a vacuum environment (i.e. space in the vacuum vessel 314).

Figure 9:
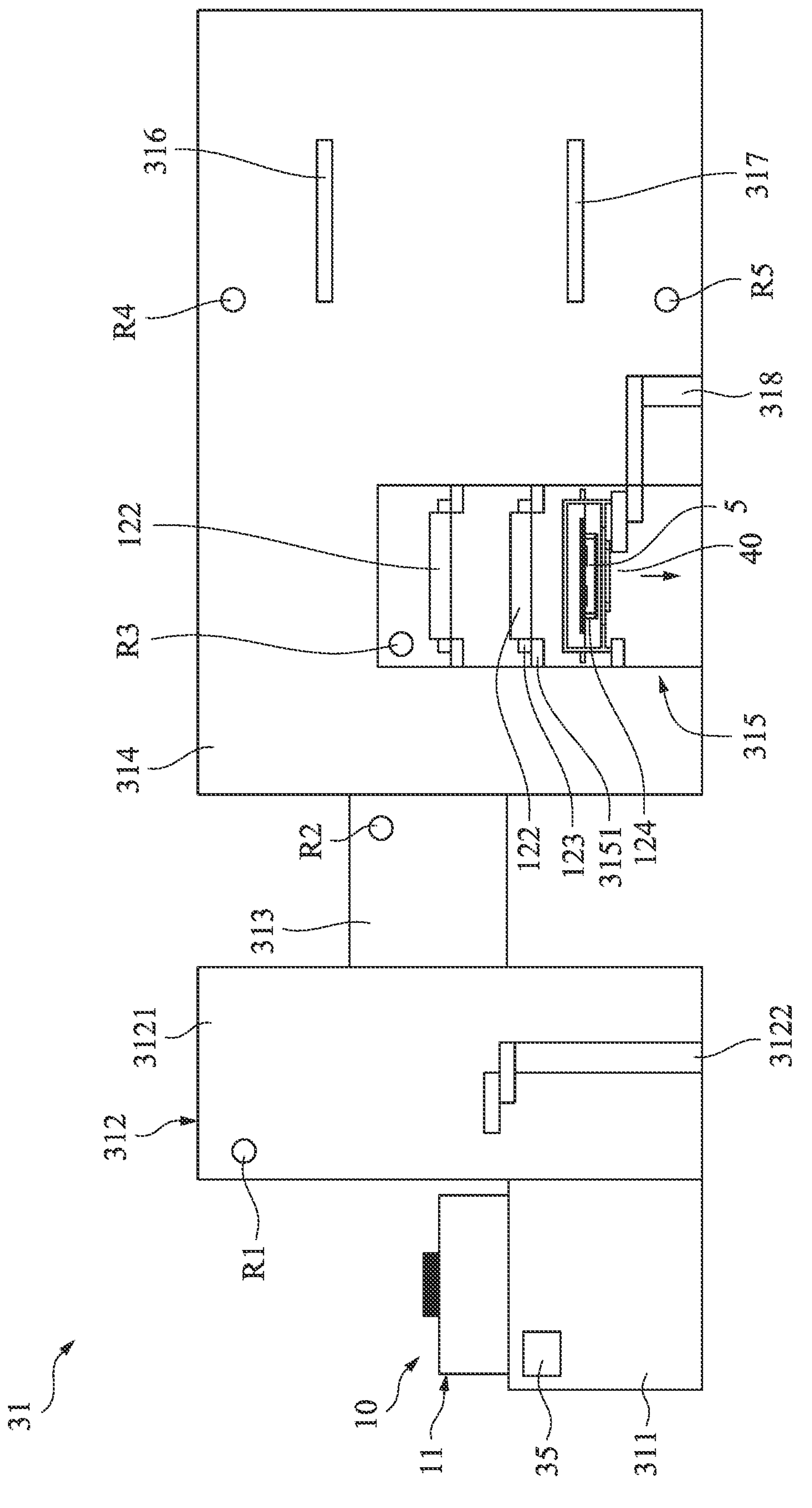
FIG. 9 shows a schematic view of one stage of a method for transporting a reticle in a lithography exposure apparatus as the reticle is positioned over a cover handling chamber in accordance with some embodiments of the present disclosure.

In some embodiments, after the inner pod 12 is moved into the vacuum environment, the inner pod 12 is transferred to the cover handling chamber 315 by the transfer mechanism 318, as shown in FIG. 9. In the cover handling chamber 315, the flanges 123 of the cover 122 are supported by the holding members 3151, and the cover 122 is left on the holding member 3151 by moving the base plate 128 in the direction indicated by the arrow in FIG. 9. As a result, the cover 122 is removed from the base plate 128. At this time, the reticle 5 is placed on the base plate 128, and the metrology device 40 on the base plate 128 is exposed to the vacuum environment.

Figure 10:
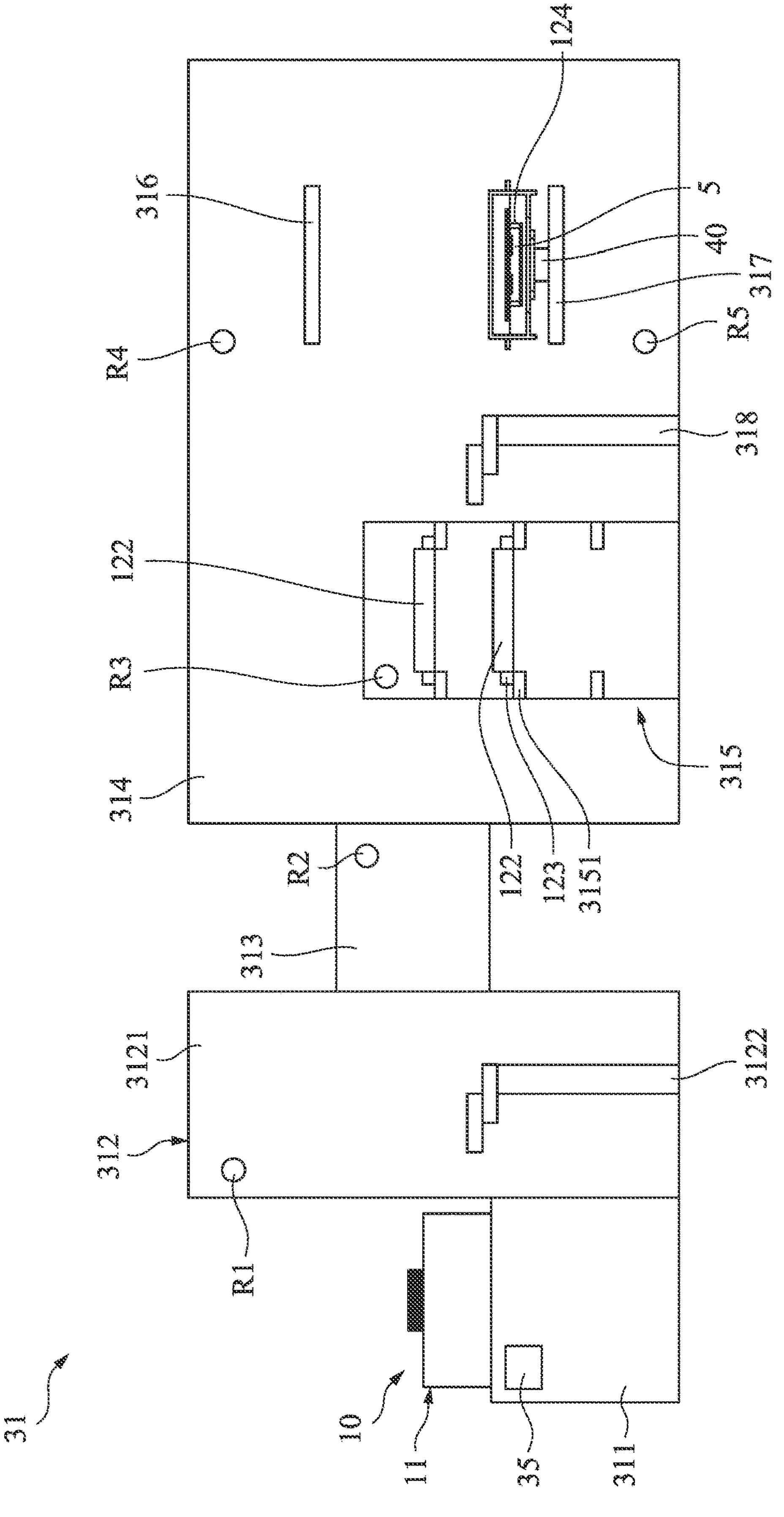
FIG. 10 shows a schematic view of one stage of a method for transporting a reticle in a lithography exposure apparatus as the reticle is positioned over a reticle exchanging station in accordance with some embodiments of the present disclosure.
Figure 11:
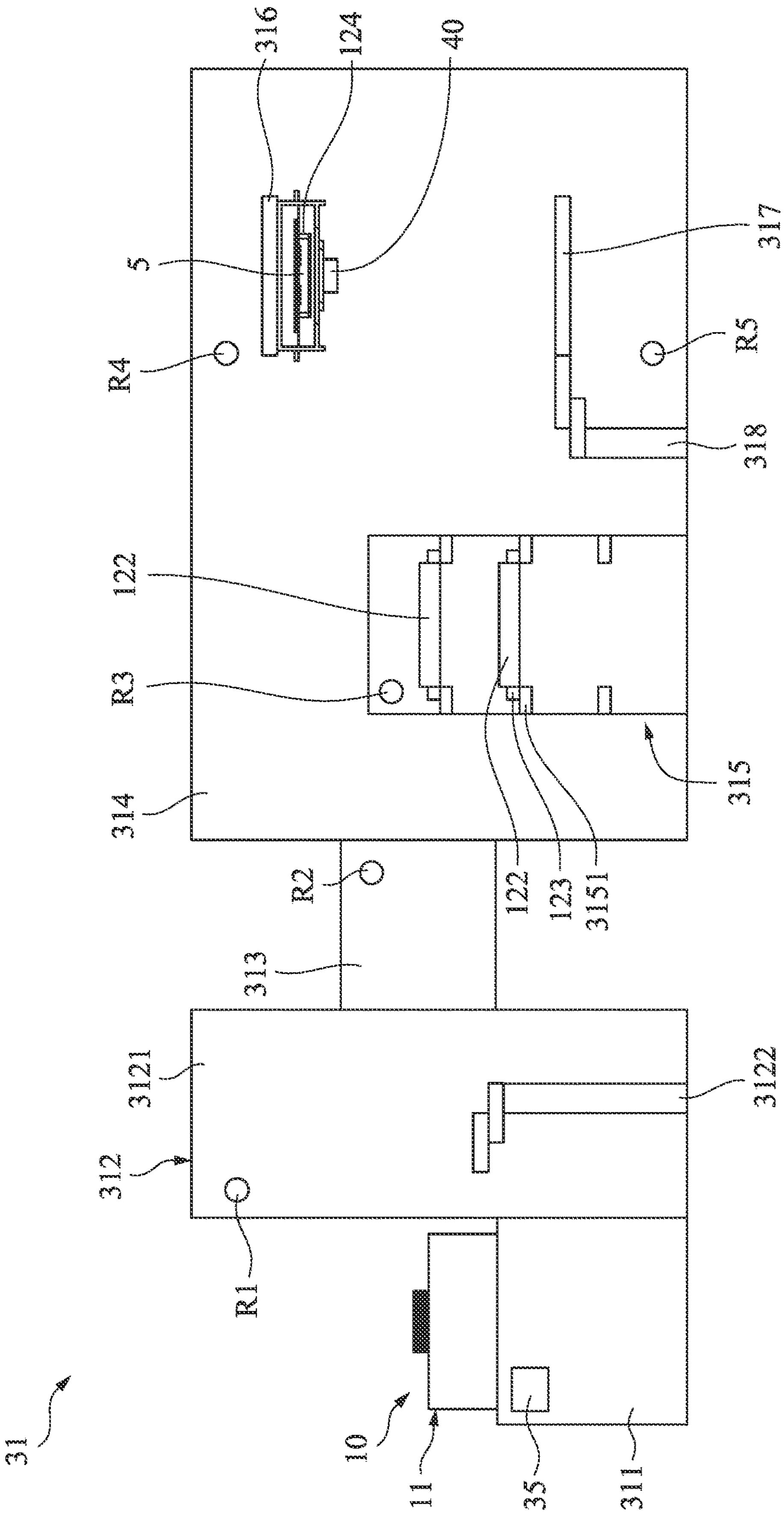
FIG. 11 shows a schematic view of one stage of a method for transporting a reticle in a lithography exposure apparatus as the reticle is positioned over a reticle chuck in accordance with some embodiments of the present disclosure.

In some embodiments, after the cover 122 is removed from the base plate 128, the base plate 128 and reticle 5 are placed on the reticle exchanging station 317 by the transfer mechanism 318, as shown in FIG. 10. Afterwards, the reticle exchanging station 317 is elevated to a loading position as indicated by the dotted lines in FIG. 11 to create a direct contact between the reticle 5 and the reticle chuck 316. As a result, the reticle 5 is secured by the reticle chuck 316 with the clamping force generated by the reticle chuck 316 and is ready for the lithography exposure process, such as being subjected to an extreme ultraviolet (EUV) light. After the reticle 5 is secured by the reticle chuck 316, the vacant base plate 128 is lowered down to its original position as indicated by solid lines in FIG. 11.

The method S10 further proceeds to operation S13, in which the pellicle conditions around on reticle 5 are measured by the metrology device 40. In some embodiments, the pellicle conditions around on the reticle 5 are measured using the metrology device 40 when the inner pod 12 is closed. For example, the measurement of the pellicle conditions of the reticle 5 is initiated when the inner pod 12 is removed from the outer pod 11 and is terminated when the cover 122 is removed from the base plate 128. In this case, since the pellicle conditions in the inner pod 12 are measured, the health of the reticle 5 can be monitored. In some embodiments, the pellicle conditions on the reticle 5 are measured using the metrology device 40 when the inner pod 12 is open. For example, the measurement of the pellicle conditions on the reticle 5 is initiated when the cover 122 is removed from the base plate 128 and is terminated when the reticle 5 is removed from the base plate 128 by the reticle chuck 316. In this case, since the pellicle conditions in the vacuum vessel 314 are measured, the health of the lithography exposure apparatus 31 can be monitored. In some embodiments, the pellicle conditions around the reticle 5 are measured using the metrology device 40 no matter whether the inner pod 12 is closed or open.

In some embodiments, the data associated with the pellicle conditions on the reticle 5 is produced by the metrology device 40 according to the detected result. Afterwards, the data may be sent to one of the nearby signal receivers R1, R2, R3, R4 and R5 through wireless connections, and the data received by the signal receivers R1, R2, R3, R4 and R5 are is transmitted to the FDC system 50 for data analysis. Alternatively, the data is stored in the storage device 46 of the metrology device 40 and is transmitted to the FDC system 50 when the metrology device 40 is coupled to the interface device 35.

The method S10 further proceeds to operation S24, in which the data associated with the measured pellicle conditions produced in operation S23 is compared with data associated with the expected pellicle conditions collected in operation S21.

After operation S24, if the measured pellicle conditions are within the range of acceptable value, the method repeats operations S23 and S24 until a predetermined period for monitoring pellicle conditions on the reticle carrier 10 is finished, for example, until the reticle 5 is secured by the reticle chuck 316. However, if the measured pellicle conditions exceed the range of acceptable values, the method continues with operation S25, in which an alarm condition is indicated. In some embodiments, when the data processed by the FDC system 50 indicates that the measured environmental conditions have departed from the expected environmental conditions (in other words, when the FDC system 50 detects a fault or abnormality), the FDC system 50 triggers an alarm. In this case, the FDC system 50 triggers an alarm and notifies the control system 60 to move the inner pod 12 along with the reticle 5 being loaded into the outer pod 11. Afterwards, the reticle carrier 10 along with the reticle 5 are moved to a maintenance station 90 (FIG. 2) for maintenance, so that any issues with the reticle 5 may be identified and remedied and to prevent excessive scrap wafer from being produced in the lithography exposure apparatus 31.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a method for monitoring a pellicle condition of the EUV mask during the transferring of the mask without opening EUV inner pod (EIP) cover thereof, which in turn reduces the risk of pellicle damagement and real-time monitors pellicle status during the transferring of the EUV mask.

In some embodiments, a method includes transferring an inner pod of a carrier out from an outer pod of the carrier into a lithography exposure apparatus, the inner pod containing a reticle including a reflective multilayer and a pellicle underlying the reflective multilayer; detecting a condition of the pellicle using a metrology device positioned on a base plate of the inner pod during transferring the inner pod in the lithography exposure apparatus; determining whether the condition of the pellicle is acceptable; issuing a warning when the condition of the pellicle is not acceptable. In some embodiments, the method further includes removing a cover of the inner pod to expose the reticle in an interior of the lithography exposure apparatus, wherein detecting the condition of the pellicle using the metrology device is performed prior to removing the cover of the inner pod. In some embodiments, the method further includes removing a cover of the inner pod to expose the reticle in an interior of the lithography exposure apparatus, wherein detecting the condition of the pellicle using the metrology device is performed after removing the cover of the inner pod. In some embodiments, detecting the condition of the pellicle using the metrology device is performed while the reticle is in a movement. In some embodiments, detecting the condition of the pellicle using the metrology device is performed while the reticle is stationary. In some embodiments, the metrology device is a wireless camera, and detecting the condition of the pellicle is performed by using the wireless camera to capture an image of the pellicle. In some embodiments, the base plate of the inner pod has a central portion made of a transparent material, and the metrology device is further positioned at a bottom surface of the central portion of the base plate. In some embodiments, a first dimension of the central portion of the base plate is the same as a second dimension of the base plate perpendicular to the first dimension from a top view. In some embodiments, the central portion of the base plate has a rectangular pattern from a top view. In some embodiments, determining whether the condition of the pellicle is acceptable includes: comparing the detected condition with a reference condition of the pellicle; determining whether a result of a comparison between the detected condition and a reference condition of the pellicle is outside of a range of an acceptable value.

In some embodiments, a method includes transferring a carrier by a transferring apparatus from a first position to a second position, the carrier including an inner pod and an outer pod housing the inner pod, the inner pod containing a reticle including a reflective multilayer and a pellicle underlying the reflective multilayer; capturing an image of the pellicle during transferring the carrier; comparing the captured image of the pellicle with a reference image of the pellicle; determining whether the pellicle is broken according to a result of the comparison between the captured image and the reference image; issuing a warning when the pellicle is broken. In some embodiments, capturing the image of the pellicle is performed by using an image sensor positioned on a base plate of the inner pod. In some embodiments, capturing the image of the pellicle is performed from an outside of the inner pod. In some embodiments, transferring the carrier is performed along a route from the first position to the second position that is located at an outside of a lithography exposure apparatus. In some embodiments, capturing the image of the pellicle is performed while the reticle is in a movement.

In some embodiments, a fabrication facility includes a reticle carrier and a first metrology device. The reticle carrier is configured to receive a reticle for a lithography exposure process and includes an inner pod and an outer pod. The inner pod is configured to receive the reticle and includes a base plate and a cover covering the base plate, and the base plate has a peripheral portion and a central portion made of a transparent material. The outer pod is configured to receive the inner pod. The first metrology device is positioned on a bottom surface of the central portion of the base plate and configured to detect a first pellicle condition of the reticle. In some embodiments, the first metrology device is an image sensor. In some embodiments, the central portion of the base plate has a rectangular pattern from a top view. In some embodiments, the fabrication facility further includes a second metrology device positioned at the bottom surface of the central portion of the base plate and configured to detect a second pellicle condition of the reticle. In some embodiments, the fabrication facility further includes a transferring apparatus and a control system. The transferring apparatus is configured to transfer the reticle carrier. The control system is configured to control the transferring apparatus to move the reticle carrier for maintenance when the first pellicle condition detected by the first metrology device is outside a range of acceptable values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

transferring an inner pod of a carrier out from an outer pod of the carrier into a lithography exposure apparatus, wherein the inner pod contains a reticle including a reflective multilayer and a pellicle underlying the reflective multilayer, and the inner pod comprises a base plate and a cover covering the base plate, the base plate having a peripheral portion and a transparent central portion;

detecting a condition of the pellicle using a first metrology device mounted via a support structure directly onto a bottom surface of the transparent central portion of the base plate of the inner pod while the inner pod is located within the lithography exposure apparatus;

determining whether the condition of the pellicle is acceptable; and issuing a warning when the condition of the pellicle is not acceptable.

2. The method of claim 1, further comprising:

removing the cover of the inner pod to expose the reticle in an interior of the lithography exposure apparatus, wherein detecting the condition of the pellicle using the first metrology device is performed prior to removing the cover of the inner pod.

3. The method of claim 1, further comprising:

removing the cover of the inner pod to expose the reticle in an interior of the lithography exposure apparatus, wherein detecting the condition of the pellicle using the first metrology device is performed after removing the cover of the inner pod.

4. The method of claim 1, wherein detecting the condition of the pellicle using the first metrology device is performed while the reticle is in a movement.

5. The method of claim 1, wherein detecting the condition of the pellicle using the first metrology device is performed while the reticle is stationary.

6. The method of claim 1, wherein the first metrology device is a wireless camera, and detecting the condition of the pellicle is performed by using the wireless camera to capture an image of the pellicle.

7. The method of claim 1, wherein a first dimension of the transparent central portion of the base plate is the same as a second dimension of the base plate perpendicular to the first dimension from a top view.

8. The method of claim 1, wherein the transparent central portion of the base plate has a rectangular pattern from a top view.

9. The method of claim 1, wherein determining whether the condition of the pellicle is acceptable comprises:

comparing the detected condition with a reference condition of the pellicle; and determining whether a result of a comparison between the detected condition and the reference condition of the pellicle is outside of a range of an acceptable value.

10. The method of claim 1, further comprising:

detecting a second condition of the pellicle using a second metrology device, different from the first metrology device, positioned at the bottom surface of the transparent central portion of the base plate while the inner pod is located within the lithography exposure apparatus.

11. A method, comprising:

transferring a carrier by a transferring apparatus from a first position to a second position, the carrier including an inner pod and an outer pod housing the inner pod, the inner pod containing a reticle including a reflective multilayer and a pellicle underlying the reflective multilayer;

capturing an image of the pellicle during transferring the carrier;

comparing the captured image of the pellicle with a previously stored reference image of a structurally intact pellicle;

determining whether the pellicle is broken according to a result of the comparison between the captured image and the previously stored reference image; and issuing a warning when the pellicle is broken.

12. The method of claim 11, wherein capturing the image of the pellicle is performed by using an image sensor positioned on a base plate of the inner pod.

13. The method of claim 11, wherein capturing the image of the pellicle is performed from an outside of the inner pod.

14. The method of claim 11, wherein transferring the carrier is performed along a route from the first position to the second position that is located at an outside of a lithography exposure apparatus.

15. The method of claim 11, wherein capturing the image of the pellicle is performed while the reticle is in a movement.

16. A fabrication facility, comprising:

a reticle carrier configured to receive a reticle for a lithography exposure process, wherein the reticle carrier comprises:

an inner pod configured to receive the reticle, the inner pod comprising a base plate and a cover covering the base plate, the base plate having a peripheral portion and a transparent central portion; and an outer pod configured to receive the inner pod; and a first metrology device mounted via a support structure directly onto a bottom surface of the transparent central portion of the base plate and configured to detect a first pellicle condition of the reticle.

17. The fabrication facility of claim 16, wherein the first metrology device is an image sensor.

18. The fabrication facility of claim 16, wherein the transparent central portion of the base plate has a rectangular pattern from a top view.

19. The fabrication facility of claim 16, further comprising:

a second metrology device positioned at the bottom surface of the transparent central portion of the base plate and configured to detect a second pellicle condition of the reticle.

20. The fabrication facility of claim 16, further comprising:

a transferring apparatus configured to transfer the reticle carrier; and a control system configured to control the transferring apparatus to move the reticle carrier for maintenance when the first pellicle condition detected by the first metrology device is outside a range of acceptable values.

* * * * *